United States Patent
Zhang

(10) Patent No.: US 7,116,105 B1
(45) Date of Patent: Oct. 3, 2006

(54) MAGNETIC FIELD MAPPING DURING SSFP USING PHASE-INCREMENTED OR FREQUENCY-SHIFTED MAGNITUDE IMAGES

(75) Inventor: Weiguo Zhang, Foster City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 11/095,520

(22) Filed: Apr. 1, 2005

(51) Int. Cl.
*G01V 3/00* (2006.01)

(52) U.S. Cl. .................................. 324/307; 324/309

(58) Field of Classification Search .......... 324/307, 324/309
See application file for complete search history.

(56) References Cited

U.S. PATENT DOCUMENTS

| | | | |
|---|---|---|---|
| 5,909,119 A | 6/1999 | Zhang et al. | |
| 6,275,038 B1 * | 8/2001 | Harvey | 324/309 |
| 6,307,368 B1 * | 10/2001 | Vasanawala et al. | 324/309 |
| 6,856,134 B1 * | 2/2005 | Reeder et al. | 324/309 |
| 6,906,516 B1 * | 6/2005 | Bangerter et al. | 324/309 |
| 2003/0042905 A1 | 3/2003 | Miyazaki et al. | |
| 2004/0064035 A1 | 4/2004 | Miyoshi et al. | |
| 2005/0030023 A1 | 2/2005 | Bangerter et al. | |

OTHER PUBLICATIONS

Y.C. Chung and J.L. Duerk, "Signal Formation in Echo Shifted Sequences", Proceedings of Seventh Scientific Meeting and Exhibition of International Society for Magnetic Resonance in Medicine, Philadelphia, PA, 1999, p. 5.

S.S. Vasanawala, J.M. Pauly, and D.G. Nishimura, "Linear Combination SSFP", Proceedings of Seventh Scientific Meeting and Exhibition of International Society for Magnetic Resonance in Medicine, Philadelphia, PA, 1999, p. 11.

Shreyas Vasanawala et al., "Linear Combination Steady-State Free Precession MRI", Magnetic Resonance In Medicine 43:82-90 (2000).

Dong-Hyun Kim et al., "Regularized Higher-Order In Vivo Shimming", Magnetic Resonance in Medicine 43:715-722 (2002).

Yuval Zur et al., "An Analysis Of Fast Imaging Sequences With Steady-State Transverse Magnetization Refocusing", Magnetic Resonance In Medicine 6, 175-193 (1988).

(Continued)

*Primary Examiner*—Louis M. Arana
(74) *Attorney, Agent, or Firm*—Nixon & Vanderhye P.C.

(57) ABSTRACT

A system has been developed for mapping the magnetic field during a balanced steady-state free precession (SSFP) sequence. Field maps are generated by analyzing the magnitude of images acquired using the SSFP imaging sequences with phase increment or frequency shift. The system maps the magnetic field relevant to the imaging sequence and need not rely on phase information. The field maps may be applied to adjust the hardware for correcting the field anomalies contained in the maps. The field maps may also be used for separation of water and fat signals in SSFP imaging.

24 Claims, 6 Drawing Sheets

OTHER PUBLICATIONS

Y. Zur et al., "Motion-Insensitive, Steady-State Free Precession Imaging", Magnetic Resonance In Medicine 16, 444-459 (1990).

M. Miyoshi et al., "SSFP Fat Water Separation By Fourier Transfer Phase Cycling And The Single Quadrature Dixon Method", Proc. Intl. Soc. Mag. Reson. Med. 11 (2003), p. 981.

W. Zhang et al., "An Approach To True Water-Fat Separation By Phase-Cycled SSFP And Single Quadrature Dixon", Proc. Intl. Soc. Mag. Reson. Med. 11 (2004), p. 2684.

Klaus Scheffler et al., "Principles And Applications Of Balanced SSFP Techniques", Eur. Radiol. (2003) 13:2409-2418.

* cited by examiner

MAGNETIC FIELD MAPPING DURING SSFP USING PHASE-INCREMENTED OR FREQUENCY-SHIFTED MAGNITUDE IMAGES

BACKGROUND OF THE INVENTION

Conventional magnetic resonance imaging (MRI) methods rely on a linear relationship between magnetic fields and spatial positions of the nuclear spins within the object being imaged. This relationship is realized by using a combination of homogeneous magnets and linear gradient coils. Deviations from this linear relationship can cause undesired image distortions and sometimes artifacts.

Field anomalies are deviations of magnetic fields from prescribed values. Anomalies can be static as well as sequence-induced. Static anomalies may occur from, for example, field inhomogeneities produced by the magnet used to generate the main static magnetic field. Sequence-induced anomalies may occur from, for example, eddy-currents or the Maxwell fields.

Two remedies often used for correcting anomalies in magnetic field are: (i) minimization of inhomogeneities by shimming the magnetic field using special shimming hardware, and (ii) post data acquisition image correction to compensate for the effects of the field anomalies. These remedies require accurate information about the spatial distribution of the magnetic field at the time when the image data is acquired.

Conventionally, maps of the magnetic field are generated using dedicated field-mapping sequences. Since images are acquired using a different sequence, such field maps contain no information about sequence-induced field anomalies relevant to the imaging sequence. In cases when the sequence-induced changes are significant, such as during balanced steady-state free precession (SSFP) sequences, it is preferable that the field maps be generated using the exact same sequence that is used for imaging.

In addition, field maps are often generated from the phases of the acquired images. As anyone skilled in the art understands, phases of acquired magnetic resonance (MR) signals can be affected by factors other than the static magnetic field. Such factors include, but not limited to, chemical shifts and radio-frequency (RF) field orientation. For example, in the single quadrature Dixon (SVD) method recently introduced for water-fat separated SSFP, maps of magnetic field are obtained from the phases of the isolated echo images. Since the phases of the echo signals are influenced by field inhomogeneities as well as chemical shifts, the magnetic field maps so generated are susceptible to interference from chemical shifts.

There is therefore a need for improved methods to generate magnetic field maps that are relevant to imaging sequences, wherein the maps are not degraded by interferences such as that from chemical shifts.

BRIEF DESCRIPTION OF THE INVENTION

A system has been developed for mapping the magnetic field during a balanced steady-state free precession (SSFP) sequence. A field map is generated using the data acquired during the same phase-incremented or frequency-shifted SSFP sequences used to generate the images. The system maps the magnetic field by analyzing the magnitude images pixel-by-pixel. The system need not rely on phase information.

A field map is generated by analyzing the magnitude images acquired using a phase-incremented or frequency-shifted balanced SSFP sequence. Pixel intensities are surveyed as a function of the phase increment or frequency shift used during the data acquisition. The precession angles of the nuclear spins during each time of repetition (TR) period are determined for each pixel from the radio frequency (RF) phase increment or frequency shift that yields a minimum pixel intensity. The map of the precession angles is unwrapped to form a field map of the magnetic field.

The magnetic field map so generated includes information regarding the static magnetic field inhomogeneities and any effects of sequence-induced field changes. The magnetic field map can be used to automatically shim the magnetic field so as to compensate for the static field inhomogeneities as well as to compensate for the sequence-induced field anomalies during SSFP. The magnetic field map can also be used during post-data acquisition processing to correct for the effects of the field anomalies, such as in the processes for separation of water and fat signals.

DETAILED DESCRIPTION OF THE INVENTION

Figure 1:
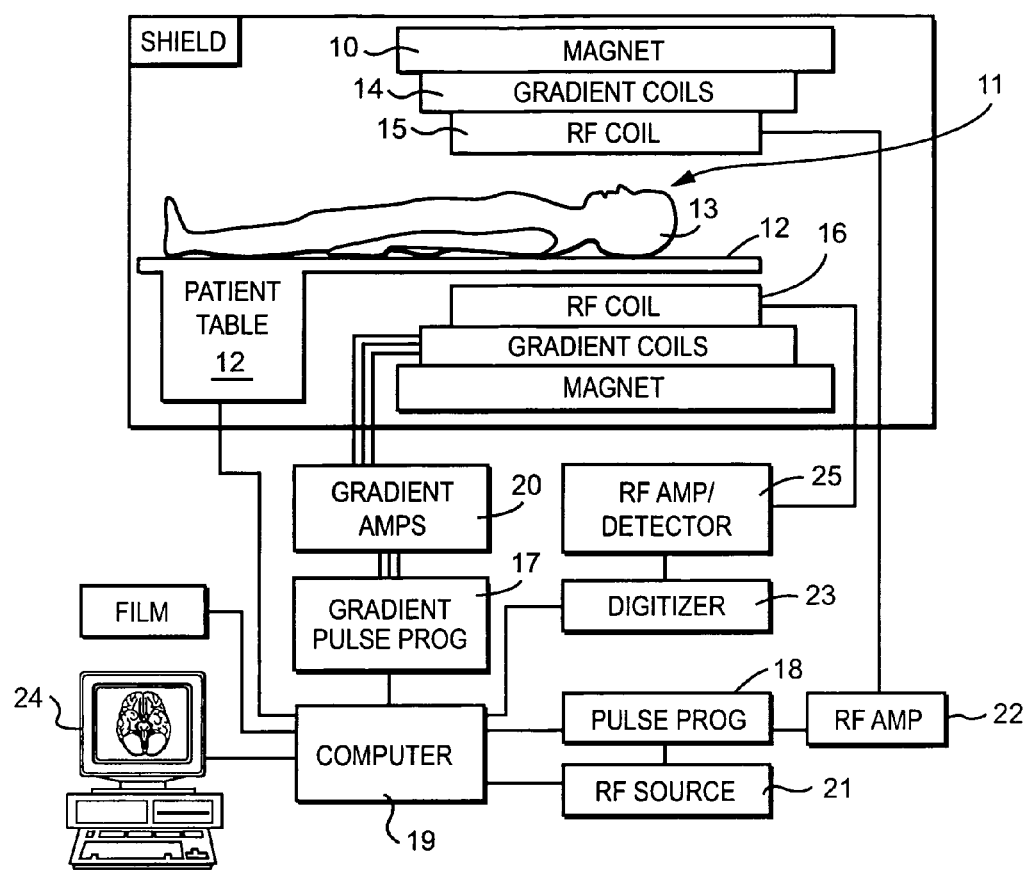
FIG. 1 is a schematic diagram of an MRI system.

As shown in FIG. 1, a magnetic resonance imaging (MRI) system typically includes a large magnet 10 to impose a static magnetic field ($B_0$), gradient coils 14 for imposing spatially distributed gradient magnetic fields ($G_x$, $G_y$, and $G_z$) along three orthogonal coordinates, and RF coils 15 and 16 to transmit and receive RF signals to and from the selected nuclei of the object being imaged. The object 13 lies on a movable table 12 such that a portion of the object to be imaged is moved, in three-dimensions, in an "imaging volume" 11 between the magnet and coils, which defines a field of view (FOV) of the MRI system.

To acquire MRI data, the MRI system generates magnetic gradient and RF nutation pulses via MRI pulse sequence controllers 17 and 18 that operate under the control of a programmable processor 19, e.g., a workstation computer 24. In addition, the processor 19 controls a gradient pulse amplifier 20, and RF source and amplifier circuits 21 and 22. The MR signal circuits (RF detector) 25 are suitably interfaced with MR signal RF coils 15, 16 located within the shielded MRI system gantry. The received MR RF echo signal responses are digitized by a digitizer 23 and passed to the processor 19, which may include an array processors or the like for image processing and suitable computer program storage media (not shown) wherein programs are stored and selectively utilized so as to control the acquisition and processing of MR signal data and to produce images on a display of control terminal 24. The MRI system control terminal 24 may include a suitable keyboard, touch screen or other input devices for exerting operator control. Images may also be recorded directly on film, stored electronically or printed on a suitable media by a printing device.

Figure 2:
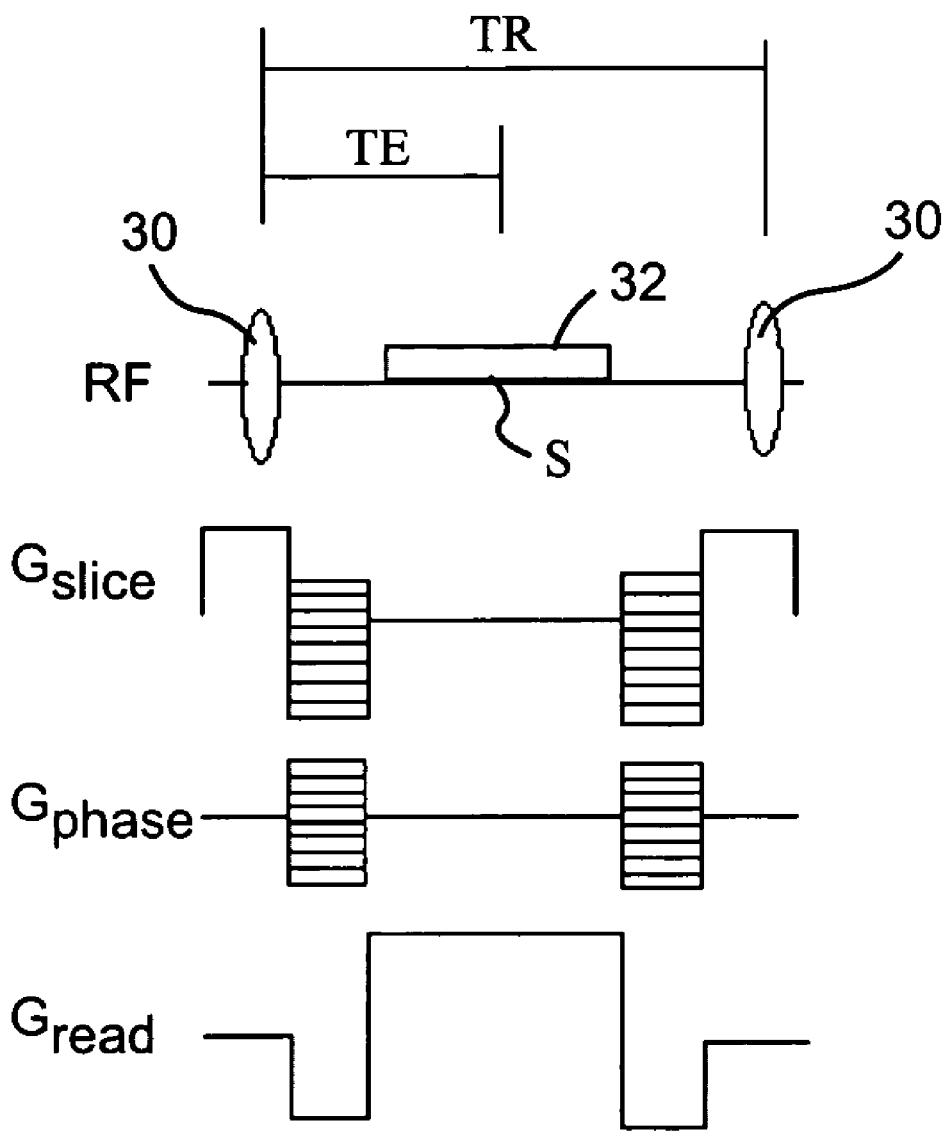
FIG. 2 is an exemplary balanced SSFP imaging sequence.

FIG. 2 schematically shows a three-dimensional (3D) magnetic resonance imaging sequence with fully refocused steady-state free precession (SSFP). A radio frequency (RF) excitation pulse 30 is applied to the object being scanned. The RF pulse 30 is repeatedly applied with a time of repetition (TR). An RF echo signal (S) is received during a data acquisition (ADC) period 32. The received echo signal occurs after a time to echo (TE) period that begins at the center of the RF pulse 30. Gradient magnetic fields are applied in the x, y and z directions to select and encode a set of slices (Gslice) of the object for imaging and to spatially phase encode (Gphase) the excited nuclei of the selected slices. A readout magnetic field gradient (Gread) is applied during the ADC period to frequency-encode the received echo signal.

Steady-state free precession (SSFP) is a technique used to generate MRI signals from precessing hydrogen nuclei that do not completely return to their thermal equilibrium state. The SSFP sequence uses a series of RF excitation pulses and magnetic gradient pulses applied at repetition times (TR) significantly shorter than the spin-lattice (T1) and the spin—spin (T2) relaxation times of hydrogen nuclei within the object being imaged. In a fully refocused SSFP sequence, the magnetic gradient pulses are fully balanced, i.e., the total area (gradient moments) of all gradient pulses in each TR period is zero for each gradient channel.

Theory of Magnetic Field Mapping During SSFP:

During a TR period of the SSFP sequence, the nuclear spins precess to accumulate a precession angle (Ø) that depends on the field offset:

$\phi = \gamma \Delta B_0 TR$

The magnitude of the SSFP signal (S) depends on this spin precession angle:

$$S = \frac{ae^{i\phi} + b}{c\cos(\phi) + d}$$

$a = -(1-E_1)E_2 \sin(\alpha)$ $b = (1-E_1)\sin(\alpha)$ $c = E_2(E_1-1)(1+\cos(\alpha))$ $d = 1 - E_1 \cos(\alpha) - (E_1 - \cos(\alpha))E_2^2$ $E_1 = e^{-TR/T_1}$ $E_2 = e^{-TR/T_2}$ where S is the steady-state signal generated in a SSFP sequence; $\Delta B_0$ is the field offset that includes static field inhomogeneities as well as sequence-induced field anomalies; $\gamma$ is the gyromagnetic ratio of the nuclei imaged; $\alpha$ is the flip angle used by the SSFP sequence; TR is the time-of-repetition of the SSFP sequence; $T_1$ and $T_2$ are spin-lattice and spin—spin relaxation times of the nuclear spins, respectively.

Figure 3:
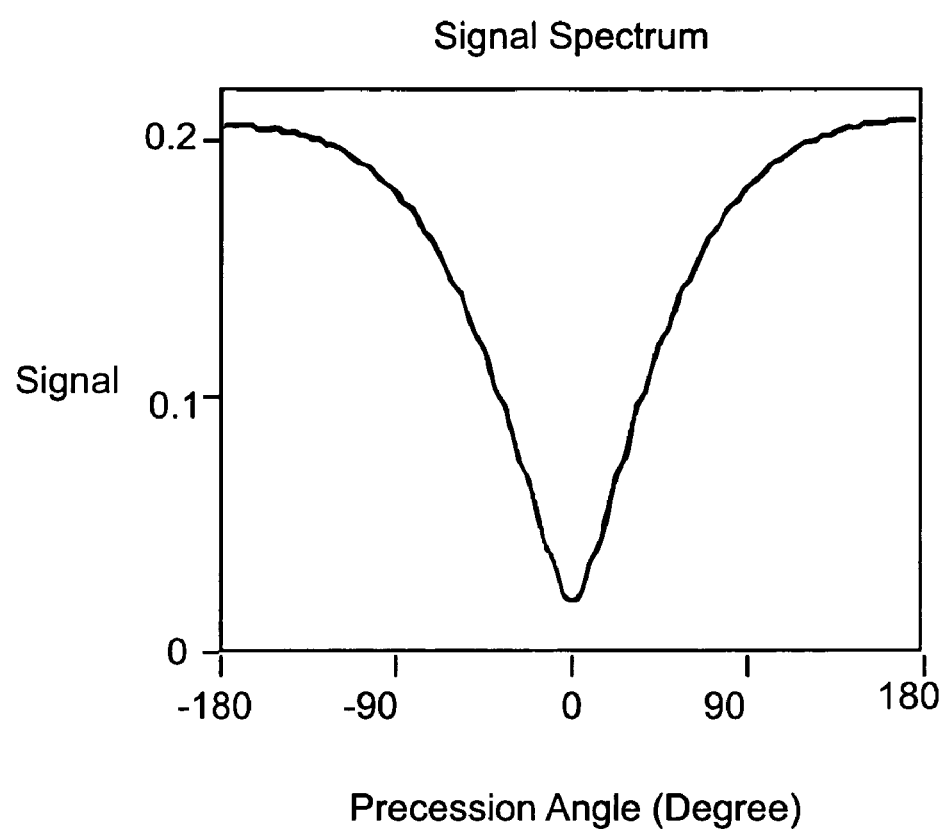
FIG. 3 is a graph of the theoretical spectrum of the magnitude of the steady-state transverse magnetization as a function of the precession angle acquired in a balanced SSFP sequence.

FIG. 3 is a graph of the magnitude of the steady-state transverse magnetization acquired in a balanced SSFP sequence as a ratio to the equilibrium magnetization. FIG. 3 shows a theoretical spectrum of magnitudes of the SSFP signal assuming TR=10 ms, $\alpha$=55°, $T_1$=500 ms and $T_2$=80 ms.

As is evident from FIG. 3, the SSFP signal is smallest when the spin precession angle is zero, i.e. when the spin precession frequency matches that of the RF carrier of the MRI system. In a phase-incremented SSFP sequence, the phase of the RF excitation pulse is incremented from one TR period to next in accordance with $\theta_{i+1} = \theta_i + \delta$ where $\theta$ represents the RF phase and $\delta$ represents the RF phase increment. This phase increment scheme has the same effect on the SSFP signals as that of a frequency shift with an equivalent frequency offset of $$\Delta f = \frac{\delta}{2\pi TR}.$$

The phase-incremented SSFP signal is minimal when the spin precession angle matches that of the phase increment of the RF pulse. By finding the RF phase increment at which the minimum RF signal occurs, the spin precession angle of the nuclear spins for each pixel of the images can be determined.

Because the spectrum of SSFP signal has a period of $2\pi$, the measured spin precession angles are wrapped into between $-\pi$ and $+\pi$. Field offset is related to the measured spin precession angle by:

$\phi_{meas} = \gamma \Delta B_0 TR \pm n2\pi$

Unwrapping of the $\phi_{meas}$ map yields a magnetic field map ($\Delta B_0$):

$$\Delta B_0 = \frac{unwrap\{\phi_{meas}\}}{\gamma TR}$$

Figure 4:
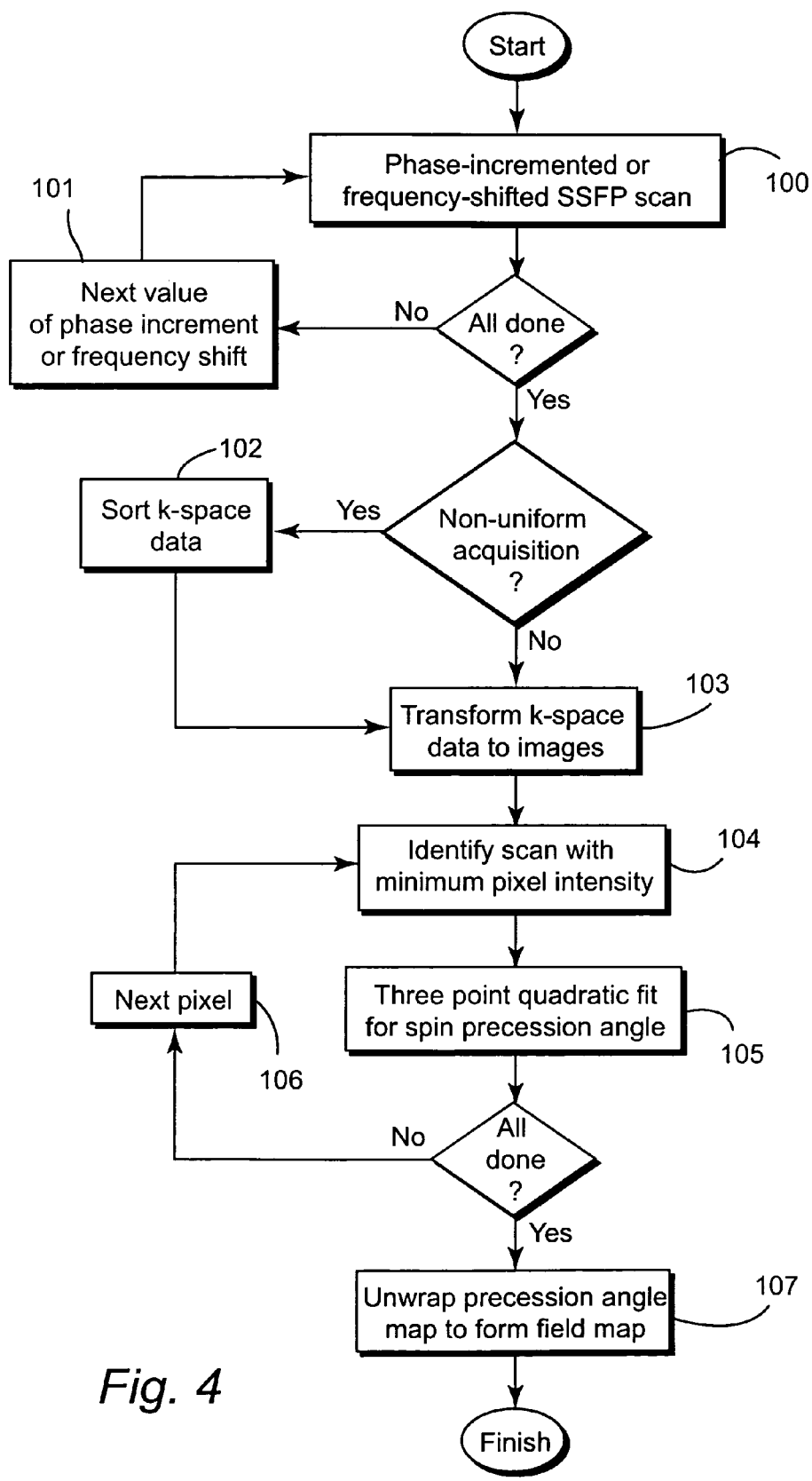
FIG. 4 is a flow chart of steps for acquiring phase-incremented or frequency-shifted SSFP data and generating maps of the magnetic field.

FIG. 4 shows a flow chart of an exemplary method for generating a magnetic field map from phase-incremented or frequency-shifted SSFP acquisition. In step 100, multiple scans of SSFP are performed with phase cycling or frequency-shifting. Each scan is performed with a prescribed value of phase-increment between the repetitions or an equivalent value of frequency-shift. The scans are taken of the same object that is being imaged using the exact same imaging sequence.

For phase-incremented SSFP acquisition, the phase of the RF pulse is incremented between scan repetitions. The phase increment (step 101) is varied from scan to scan to cover a range of 0 to $2\pi$, as follows:

$\phi_i = \phi_{i-1} + \delta_j$ $\delta_j = j2\pi/N$ where i is the index for repetition in a range of 0 to M−1; j is the index for scan in a range of 0 to N−1, and M and N are the total number of repetitions per scan and the total number of scans, respectively.

For frequency-shifted SSFP acquisition, the RF carrier frequency is incremented (step 101) from scan to scan according to:

$f_j = f_0 + \Delta f_j$ $\Delta f_j = j2\pi/(N \cdot TR)$ where $f_0$ is the RF carrier frequency without offset; $f_j$ is the RF carrier frequency used for scan j; $\Delta f_j$ is the RF frequency offset used for scan j, and TR is the repetition time of the SSFP sequence.

A single set of scans can be used both for field mapping and imaging. Alternatively, a non-uniform scheme of phase increment or frequency shift can be used in step 100. In such non-uniform scheme, the center of the k-space is acquired more frequently than the outer portions of the k-space data.

Figure 5:
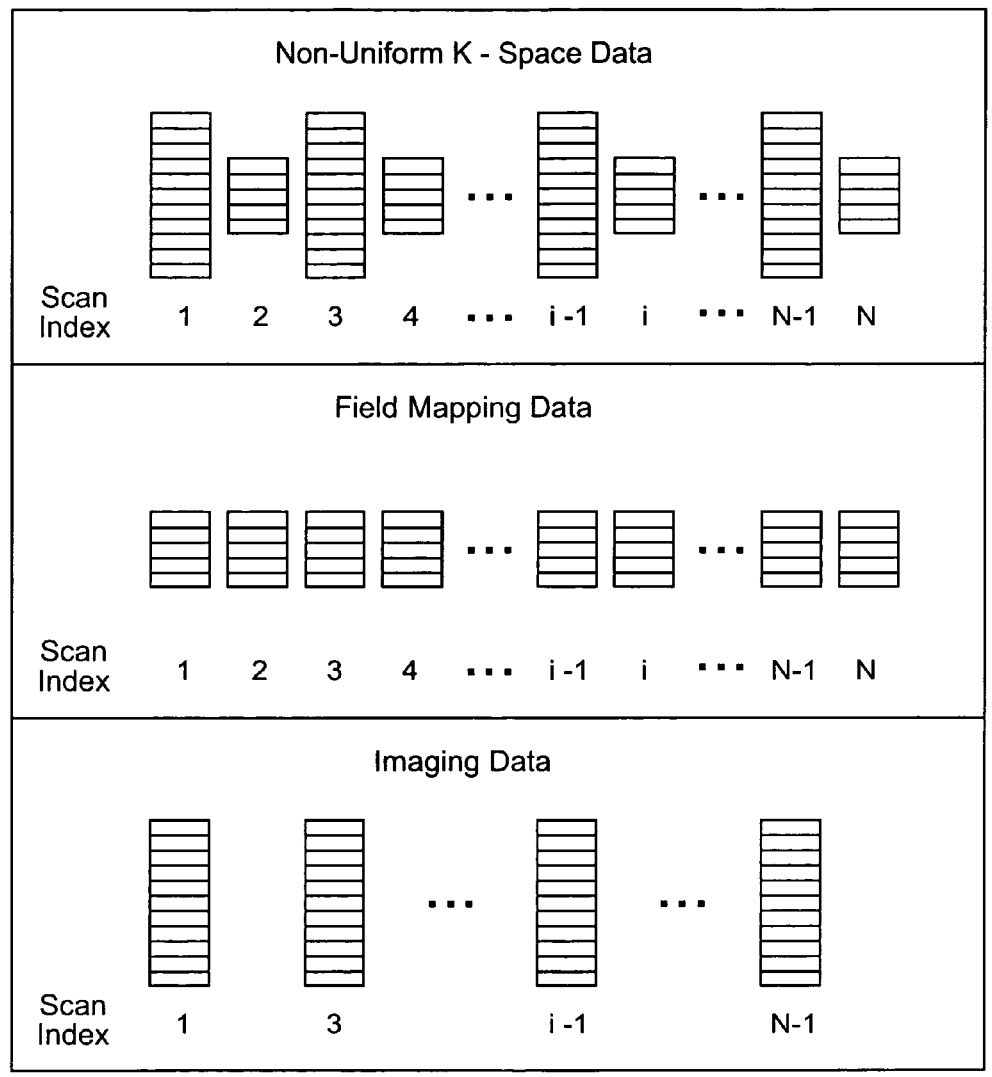
FIG. 5 is a schematic diagram of non-uniformly sampled k-space data that is sorted into data for imaging and data for field mapping.

FIG. 5 illustrates an example of such non-uniformly acquired k-space data. In this example, the center portion of k-space is sampled twice as frequently as the outer portion of the k-space. For field mapping, only the center portion is used so as to cover a larger number of steps of phase increments or frequency shifts. The full k-space data, that is less frequently acquired but has higher spatial resolution, is used to obtain images. Such non-uniform schemes allow for field mapping with increased steps of phase increments or frequency shifts without significantly increasing the total scan time. Increased steps of phase increments or frequency shifts improve the accuracy in maps of the magnetic field.

In the case of non-uniform acquisition, step 102 sorts the acquired k-space data into sets for imaging and sets for field mapping. This step is skipped in the case of uniform acquisition wherein the same data is used for imaging as well as for field mapping.

In step 103, the field mapping data are transformed from k-space to image space. Algorithms for transforming k-space data to image data are conventional and well known to persons of ordinary skill in the art of MRI. The exact algorithm for the transformation can be selected based on the method used for acquiring the k-space data. For a conventional Fourier acquisition, a Fast Fourier Transform (FFT) may be used to convert the k-space data to images.

In step 104, pixel intensities are analyzed between the scans. For each pixel, the scan index that has the minimum intensity is identified as $j_{min}$. In step 105, the left and right neighbors of $j_{min}$ are first identified as follows:

$j_{left}=j_{min}-1$ and $j_{right}=j_{min}+1$ if $0<j_{min}<N-1$ $j_{left}=j_{N-1}$ and $j_{right}=j_{min}+1$ if $j_{min}=0$ $j_{left}=j_{min}-1$ and $j_{right}=j_0$ if $j_{min}=N-1$ The adjacent three data points, $(I_{left}, J_{left})$, $(I_{min}, J_{min})$, and $(I_{right}, J_{right})$ are fitted to a quadratic function for improving the precision of the minima location:

$I_j = I_0 + a(j-d_0)^2$ where $I_j$ and j are the pixel intensity and scan index, respectively, of the three above-identified pairs; and $I_0$ and $d_0$ are the minimum intensity and its scan index, respectively, that the quadratic fitting produces. The scan index ($d_0$) need not be an integer.

The scan index ($d_0$) is used to determine the phase increment responsible for generating minimum pixel intensity as follows:

$\delta_0 = d_0 2\pi/N$

In step 106, steps 104 and 105 are repeated for all pixels to generate a precession map that represents the spin precession angles pixel-by-pixel during each TR that yield minimum pixel intensities.

In step 107, the precession map is unwrapped to generate the field map as follows:

$\Delta B_0 = \text{unwrap}\{\delta_0\}/(\gamma \cdot TR)$ where $\Delta B_0$ is the field offset map; unwrap{ } represents the phase-unwrapping process such as that described in U.S. Pat. No. 5,909,119; $\gamma$ is the gyromagnetic ratio of the nuclei imaged, and TR is the repetition time of the SSFP sequence.

In step 107, for cases where both water and fat contribute to the final images, the field map may be produced from a precession map that is scaled such that water and fat signals have a difference of $2\pi$ in precession angle that is then removed by the unwrapping process:

$\Delta B_0 = \text{unwrap}\{k\delta_0\}/(\gamma \cdot k \cdot TR)$ $$k = \frac{1}{TR \cdot \Delta f_{water-fat}}$$

where $\Delta f_{water-fat}$ is the difference in resonance frequency in Hertz between the water and fat nuclear spins.

The field map ($\Delta B_0$) represents the true magnetic fields during the actual SSFP imaging sequence. This map may be used to set the shimming hardware in the MRI system to compensate the field anomalies that are reflected in the field map. Determining the settings of a shimming system according to field maps is well known to persons of ordinary skill in the art. An example of shimming an MRI system using a magnetic field map is described in the article by Kim et al., "Regularized Higher Order in Vivo Shimming", Journal of Magnetic Resonance in Medicine (MRM) 48:715–722 (2002).

Figure 6:
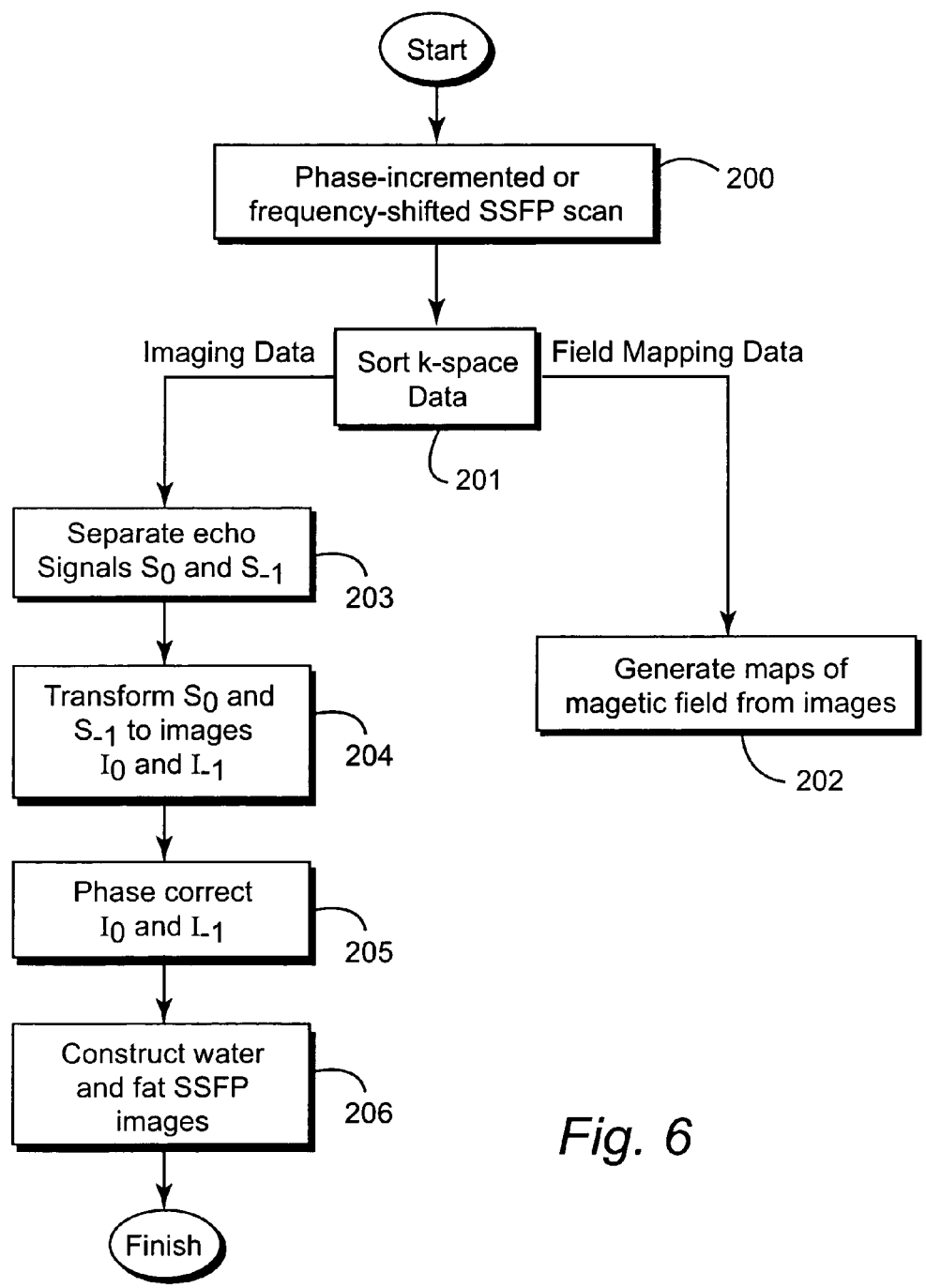
FIG. 6 is a flow chart of steps for acquiring and processing phase-incremented or frequency-shifted SSFP data for water-fat separation.

The field map may also be used to separate water and fat signals in SSFP imaging. FIG. 6 is a flow chart showing steps for acquiring and processing phase-incremented or frequency-shifted SSFP data with water-fat separation. In step 200, phase-incremented or frequency-shifted SSFP data are acquired in accordance with the above description for field mapping. The TR and TE of the sequence are selected according to:

$TR = 2TE = (2n+1)/(2\Delta f_{water-fat})$, $n=0, 1, 2 \ldots$

The non-uniform scheme of data acquisition can be used to increase the number of phase increments or frequency shifts for field mapping. In step 201, the acquired k-space data is sorted to data set for field mapping and data set for water-fat imaging. In step 202, the above-described method for field mapping using magnitude SSFP images is implemented to yield maps of the magnetic field during the imaging sequence.

In step 203, the scans in the data set for imaging are combined to separate the individual echo signals:

$$S_0 = \frac{1}{N}\sum_{j=0}^{N-1} S_j$$

$$S_{-1} = \frac{1}{N}\sum_{j=0}^{N-1} S_j e^{i(j2\pi)/N}$$

where $i=\sqrt{-1}$, j is the scan index, N is the total number of scans in the data set, and $S_0$ and $S_{-1}$ are echo signals with distinctive echo formation pathways.

In step 204, $S_0$ and $S_1$ are processed to transform from k-space to image space, using algorithms dependent on the method by which the k-space is filled, generating $I_0$ and $I_{-1}$ respectively.

In step 205, the isolated image data are phase corrected using the field map generated in step 202 as follows:

$$I_0' = I_0 e^{-i\gamma \Delta B_0 TE}$$

$$I_{-1}' = I_{-1} e^{i\gamma \Delta B_0 (TR-TE)}$$

Water and fat images are generated, in step 206, according to:

$$I_{water} = Real(I_0') + Real(I_{-1}')$$

$$I_{fat} = Imag(I_0') - Imag(I_{-1}')$$

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for generating maps of magnetic field during a balanced steady-state free precession (SSFP) sequence comprising:
    placing an object to be imaged inside an imaging volume of an MRI scanner;
    applying the balanced SSFP imaging sequence with phase increment or frequency shift to acquire a set of SSFP data in k-space;
    transforming the k-space data into images by performing Fourier transformation of the acquired SSFP data;
    generating magnitude images by determining pixel intensities of the Fourier-transformed SSFP data, and
    generating maps of the magnetic field by analyzing the magnitude images.

2. The method of claim 1 wherein applying the balanced SSFP imaging sequence further comprises multiple scans of phase-incremented or frequency-shifted SSFP performed with different values of phase increment or frequency shift in a range of 0 to $2\pi$.

3. The method of claim 1 wherein analyzing the magnitude images further comprises analyzing pixel intensities of the magnitude images between scans to identify a value of phase increment or frequency shift for each pixel that yields a minimum intensity.

4. The method of claim 1 wherein generating the magnetic field maps further comprises generating maps of spin precession angle using a three-point quadratic fitting of minimum intensity pixels.

5. The method of claim 1 wherein generating the magnetic field maps further comprises unwrapping maps of precession angles.

6. The method of claim 1 wherein applying the balanced SSFP imaging sequence further comprises acquiring k-space data wherein a center portion of the k-space is more frequently acquired than acquisition of another portion of the k-space.

7. The method of claim 6 wherein the another portion of the k-space is full k-space.

8. The method of claim 6 wherein the acquired k-space data is sorted to data for field mapping and to data for imaging.

9. The method of claim 8 wherein the data for field mapping occupy only the center portion of the k-space and have more steps of phase increment or frequency shift, and the data for imaging occupy a full k-space and have fewer steps of phase increment or frequency shift.

10. The method of claim 1 further comprising applying the maps of magnetic field to adjust the MRI scanner to compensate for field anomalies indicated in the field maps.

11. The method of claim 1 further comprising applying the maps of the magnetic field to generate water-fat separated SSFP images.

12. The method of claim 11 wherein the phase-incremented or frequency-shifted SSFP data is acquired with:

$$TR = 2TE = (2n+1)/(2\Delta f_{water-fat}), n=0, 1, 2 \ldots$$

where TR and TE are time of repetition and time of echo, respectively, of the SSFP sequence, and $\Delta f_{water-fat}$ is a difference in resonance frequency in Hertz between the water and fat nuclear spins.

13. The method of claim 11 further comprising:
    combining the acquired set of SSFP signals to produce isolated echo signals of $S_0$ and $S_{-1}$;
    transforming $S_0$ and $S_{-1}$ from k-space to image space to yield isolated images $I_0$ and $I_{-1}$, respectively;
    phase correcting the isolated echo images, and
    combining the phase-corrected isolated images to generate water or fat SSFP images.

14. A magnetic resonance imaging (MRI) system for generating maps of magnetic field during a balanced steady-state free precession (SSFP) sequence, said system comprising:
    a programmed controller coupled to radio frequency coils and magnetic gradient coils via associated circuits, wherein the controller applies a balanced SSFP imaging sequence with phase increment or frequency shift to acquire a set of SSFP data in k-space, and
    a data processor arithmetically processing the collected SSFP data to produce the field maps, wherein said processor converts the data in k-space to images by performing a Fourier transformation on the acquired SSFP data, and generates the field maps by determining pixel intensities of Fourier transformed SSFP data.

15. The system of claim 14 wherein the data processor analyzes the magnitude by analyzing pixel intensities to identify a value of phase increment or frequency shift for each pixel that yields a minimum intensity.

16. The system of claim 14 wherein maps of spin precession angle are generated using a three-point quadratic fitting of minimum intensity pixels.

17. The method of claim 16 wherein the data processor unwraps the maps of precession angles.

18. The system of claim 14 wherein applying the balanced SSFP imaging sequence further comprise acquiring k-space data wherein a center portion of the k-space is more frequently acquired than acquisition of full k-space.

19. The system of claim 18 wherein the processor sorts the acquired k-space data to data for field mapping and data for imaging.

20. The system of claim 18 wherein the data for field mapping occupy only the center portion of the k-space and have more steps of phase increment or frequency shift, and the data for imaging occupy a full k-space and have fewer steps of phase increment or frequency shift.

21. The system of claim 14 wherein the processor applies the maps of the magnetic field to adjust the MRI system to compensate for field anomalies indicated in the field maps.

22. The system of claim 14 wherein the processor applies the maps of the magnetic field to generate water-fat separated SSFP images.

23. The system of claim 22 wherein the phase-incremented or frequency-shifted SSFP data is acquired with:

$$TR = 2TE = (2n+1)/(2\Delta f_{water-fat}), n = 0, 1, 2 \ldots$$

where TR and TE are time of repetition and time of echo, respectively, of the SSFP sequence, and $\Delta f_{water-fat}$ is the difference in resonance frequency in Hertz between the water and fat nuclear spins.

24. The system of claim 22 wherein the processor further:
combines the acquired phase-incremented or frequency-shifted SSFP signals to produce isolated echo signals of $S_0$ and $S_{-1}$;
transforms $S_0$ and $S_{-1}$ from k-space to image space to yield isolated images $I_0$ and $I_{-1}$, respectively;
phase correct the isolated echo images, and
combine the phase-corrected isolated images to construct water and fat SSFP images.

\* \* \* \* \*